(12) United States Patent
Kim et al.

(10) Patent No.: US 11,171,222 B2
(45) Date of Patent: Nov. 9, 2021

(54) SEMICONDUCTOR DEVICE AND MANUFACTURING METHOD THEREOF

(71) Applicant: Magnachip Semiconductor, Ltd., Cheongju-si (KR)

(72) Inventors: Guk Hwan Kim, Cheongju-si (KR); Jin Yeong Son, Cheongju-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 16/428,022

(22) Filed: May 31, 2019

(65) Prior Publication Data

US 2020/0251575 A1 Aug. 6, 2020

(30) Foreign Application Priority Data

Jan. 31, 2019 (KR) .................. 10-2019-0013126

(51) Int. Cl.
| | |
|---|---|
| *H01L 21/762* | (2006.01) |
| *H01L 29/66* | (2006.01) |
| *H01L 29/78* | (2006.01) |
| *H01L 29/423* | (2006.01) |
| *H01L 29/08* | (2006.01) |
| *H01L 23/544* | (2006.01) |
| *H01L 27/088* | (2006.01) |
| *H01L 29/06* | (2006.01) |
| *H01L 21/761* | (2006.01) |

(52) U.S. Cl.
CPC .. *H01L 29/66681* (2013.01); *H01L 21/76224* (2013.01); *H01L 23/544* (2013.01); *H01L 27/088* (2013.01); *H01L 29/0653* (2013.01); *H01L 29/0856* (2013.01); *H01L 29/0873* (2013.01); *H01L 29/42376* (2013.01); *H01L 29/7816* (2013.01); *H01L 21/761* (2013.01); *H01L 2223/54426* (2013.01)

(58) Field of Classification Search
CPC . H01L 21/76; H01L 21/762; H01L 21/76221; H01L 29/66659; H01L 29/7835
See application file for complete search history.

(56) References Cited

U.S. PATENT DOCUMENTS

| | | | |
|---|---|---|---|
| 6,548,845 B1 * | 4/2003 | Koike | H01L 21/76828 257/296 |
| 2013/0140632 A1 * | 6/2013 | Landgraf | H01L 29/401 257/335 |
| 2015/0102405 A1 | 4/2015 | Ryu et al. | |
| 2019/0172946 A1 * | 6/2019 | Wu | H01L 21/76202 |
| 2019/0386134 A1 * | 12/2019 | Kim | H01L 29/42368 |
| 2020/0126990 A1 * | 4/2020 | Zhang | H01L 21/823878 |

* cited by examiner

*Primary Examiner* — Jae Lee
(74) *Attorney, Agent, or Firm* — NSIP Law

(57) ABSTRACT

A semiconductor device manufacturing method includes forming a first trench insulating film of a first depth in a substrate, forming at least one second trench insulating film that is spaced apart from the first trench insulating film and has a second depth that is greater than the first depth, forming a body region of a first conductivity type and a drift region of a second conductivity type in the substrate, forming a gate electrode overlapping the first trench insulating film, forming a source region in the body region and a drain region in the drift region, forming a silicide film on the drain region, and forming a non-silicide film between the first trench insulating film and the drain region, wherein the first trench insulating film overlaps the drift region and the gate electrode.

15 Claims, 24 Drawing Sheets

SEMICONDUCTOR DEVICE AND MANUFACTURING METHOD THEREOF

CROSS-REFERENCE TO RELATED APPLICATIONS

This application claims the benefit under 35 U.S.C. 119(a) of Korean Patent Application No. 10-2019-0013126 filed on Jan. 31, 2019 in the Korean Intellectual Property Office, the entire disclosure of which is incorporated herein by reference for all purposes.

BACKGROUND

1. Field

The following description relates to a semiconductor device and a manufacturing method of such a semiconductor. The following description also relates to a semiconductor device that easily forms a high-voltage device by using an offset key and a method of manufacturing of such a semiconductor.

2. Description of Related Art

Due to the development of electronic technology, there is a growing demand for small-sized multifunctional electronic devices. Accordingly, a system-on-chip (SOC) technology has been introduced to meet such a demand. System-on-Chip refers to a technology in which a plurality of devices, having different characteristics, is integrated on a single chip to implement one system.

In such an SOC technology, a high voltage operating device and a low voltage operating device are used together in parallel. However, in related arts, a process for the high voltage operating device and a process for the low voltage operating device have been carried out separately. Thus, in these alternative arts, the process procedure for the system-on-chip is complicated and the cost is high.

In addition, because the process of forming such a high-voltage-operating device requires a thermal process using a high temperature and a long processing time, there has been a problem of affecting other logic devices, which are also used in a low voltage operating circuit.

Recently, a high-voltage-operating device is implemented as an Extended Drain Metal-Oxide-Semiconductor (ED-MOS) device in order to form a high voltage-power device and a low voltage-operating device in the same process step. For example, it may be possible to replace a high voltage well of the EDMOS device with a logic well of a low voltage operating device.

FIG. 1 shows the alternative EDMOS device structure. Field oxide layers such as Local Oxidation of Silicon (LOCOS) film layers are formed in the substrate to provide a uniform electric field near the drain region of the EDMOS. However, due to a bird's beak formation of the LOCOS film, such a shape leads to an increase in the chip size, a reduction of the active region area, and an increase in the topology of the device. Also, in such an example, a top surface of the gate electrode is not coplanar with respect to a top surface of the substrate, due to the presence and shape of the LOCOS film.

Furthermore, because the LOCOS film has a depth that is shallower than a depth of a corresponding trench isolation, it is difficult to isolate a high voltage device from the other device block.

Also, because the LOCOS films are formed in the same process step, it is difficult to have various depths of the LOCOS films. That is, the depths of the LOCOS films may not be adjusted to have different depths.

SUMMARY

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

In one general aspect, a semiconductor device manufacturing method includes forming a first trench insulating film of a first depth in a substrate, forming at least one second trench insulating film that is spaced apart from the first trench insulating film and has a second depth that is greater than the first depth, forming a body region of a first conductivity type and a drift region of a second conductivity type in the substrate, forming a gate electrode overlapping the first trench insulating film, forming a source region in the body region and a drain region in the drift region, forming a silicide film on the drain region, and forming a non-silicide film between the first trench insulating film and the drain region, wherein the first trench insulating film overlaps the drift region and the gate electrode.

The method may further include forming a well region of the first conductivity type surrounding the body region and the drift region in the substrate.

The method may further include forming a body contact region of the first conductivity type in the well region.

The first trench insulating film may be formed during a same operation during which an alignment key is formed on the substrate.

The alignment key may have a shape of a square polygon or of a non-square polygon.

The alignment key may be formed on a scribe line of the semiconductor device.

The method may further include forming a first interlayer insulating film on the non-silicide film and the silicide film, forming a second interlayer insulating film and a third interlayer insulating film on the first interlayer insulating film, and forming a contact plug by etching a portion of the first, second, and third interlayer insulating films, wherein the first interlayer insulating film and the second interlayer insulating film are formed of different materials.

In another general aspect, a semiconductor device includes a first trench insulating film disposed on a substrate, a second trench insulating film spaced apart from the first trench insulating film, and disposed, deeper into the substrate than the first trench insulating film, on the substrate, a drain region disposed between the first trench insulating film and the second trench insulating film, a drift region disposed to surround the first trench insulating film and the drain region, a body region disposed to be in contact with the drift region, a source region disposed in the body region, a gate electrode disposed to overlap the first trench insulating film, a silicide film disposed on the drain region, and a non-silicide film disposed between the first trench insulating film and the drain region.

The semiconductor device may further include a well region of a first conductivity type disposed to surround the body region and the drift region, and a deep well region of a second conductivity type disposed to surround the well region.

The semiconductor device may further include a first interlayer insulating film disposed on the non-silicide film and the silicide film, a second interlayer insulating film disposed on the first interlayer insulating film, and a contact plug disposed through the first interlayer insulating film and the second interlayer insulating film, wherein the first interlayer insulating film is in direct contact with the substrate.

The first and second trench insulating films may be trench-type insulating films.

The first trench insulating film may be a local oxidation of silicon (LOCOS) oxide film, and the second trench insulating film may be a trench-type insulating film.

In another general aspect, a semiconductor device manufacturing method includes forming a first trench having a first depth in a substrate, forming a well region of a first conductivity type in the substrate, forming a second trench having a second depth that is greater than the first depth, forming first and second trench insulating films by filling the first and second trenches with insulating material, forming a body region of the first conductivity type and a drift region of a second conductivity type in the well region, forming a gate electrode overlapping the first trench insulating film, forming a source region in the body region and a drain region in the drift region, forming a silicide film on the drain region, and forming a non-silicide film between the first trench insulating film and the drain region, wherein the first trench insulating film overlaps the drift region of the second conductivity type and the gate electrode.

The method may further include forming a first interlayer insulating film on the non-silicide film and the silicide film, forming a second interlayer insulating film and a third interlayer insulating film on the first interlayer insulating film, and forming a contact plug by etching a portion of the first interlayer insulating film, the second interlayer insulating film and the third interlayer insulating film, wherein the first interlayer insulating film and the second interlayer insulating film are formed of different materials.

In another general aspect, a semiconductor device includes a first trench having a first depth in a substrate, a well region of a first conductivity type in the substrate, a second trench having a second depth that is greater than the first depth in the substrate, first and second trench insulating films formed by filling the first and second trenches with insulating material, a body region of the first conductivity type and a drift region of a second conductivity type formed in the well region, a gate electrode overlapping the first trench insulating film, a source region in the body region and a drain region in the drift region, a silicide film formed on the drain region, and a non-silicide film formed between the first trench insulating film and the drain region, wherein the first trench insulating film overlaps the drift region of the second conductivity type and the gate electrode.

The semiconductor device may further include a first interlayer insulating film formed on the non-silicide film and the silicide film, a second interlayer insulating film and a third interlayer insulating film formed on the first interlayer insulating film, and a contact plug formed by etching a portion of the first interlayer insulating film, the second interlayer insulating film and the third interlayer insulating film, wherein the first interlayer insulating film and the second interlayer insulating film are formed of different materials.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
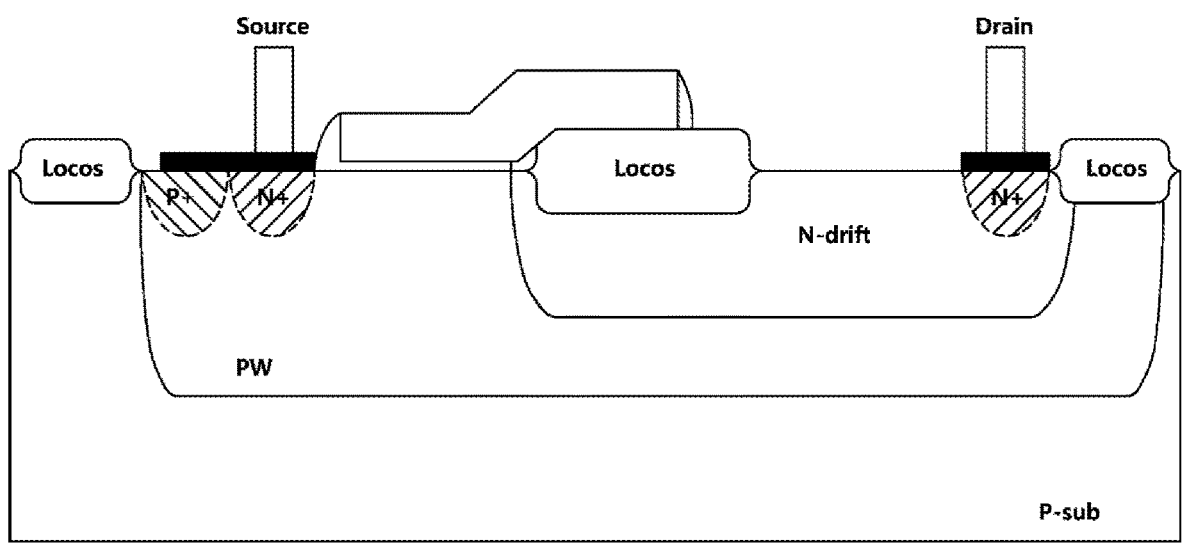
FIG. 1 is a cross-sectional view of an alternative EDMOS semiconductor device.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening there between. In contrast, when an element is described as being "directly on," "directly connected to," or "directly coupled to" another element, there can be no other elements intervening there between.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The present disclosure describes a semiconductor device that may be easily isolated from other devices, and a manufacturing method of such a semiconductor device.

In addition, the present disclosure describes a semiconductor device that may not incur additional processing steps, costs and the like while achieving all of the above purposes, and a method of manufacturing of such a semiconductor device.

The alignment key in the present specification may be interpreted as a pattern formed on a scribe line in order to precisely overlap the previous mask pattern and the present mask pattern in a stepper or a similar context.

Also, in the present examples, the EDMOS semiconductor device of the present examples may be a DMOS and an LDMOS device.

Figure 2:
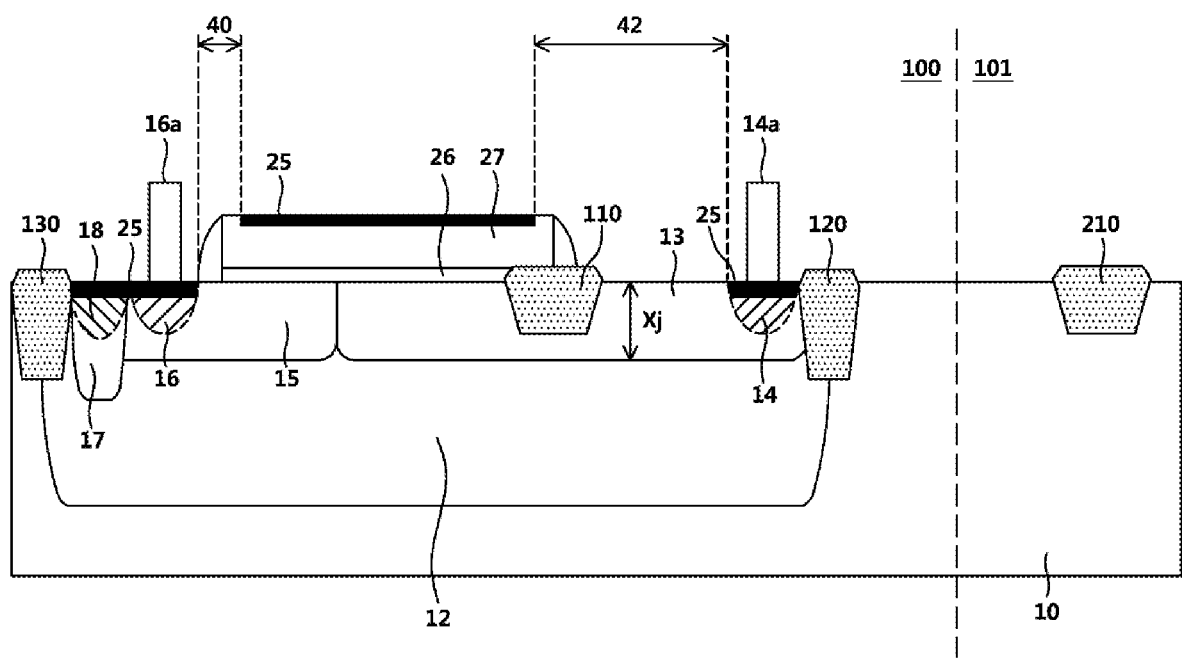
FIG. 2 is a cross-sectional view of an EDMOS semiconductor device according to an example.

FIG. 2 is a cross-sectional view of an EDMOS semiconductor device according to an example.

Referring to the example of FIG. 2, the semiconductor device may have a scribe line 101, in which an alignment key 210 is disposed, and a semiconductor circuit region 100.

The semiconductor circuit region 100 may include a substrate 10, a first trench insulating film 110 having a first depth formed on the substrate, and a second trench insulating film 120 having a second depth that may be greater than the first depth. The semiconductor circuit region 100 may further include a drain region 14, formed between the first trench insulating film 110 and the second trench insulating film 120. The semiconductor circuit region 100 may further include a drift region 13 formed to surround the first trench insulating film 110 and the drain region 14. The semiconductor circuit region 100 may include a first body region 15 formed in contact with the drift region 13, a source region 16 formed in the first body region 15, and a gate electrode 27 formed to overlap the first trench insulating film 110.

The semiconductor circuit region 100 may include a silicide film 25 formed on the source region 16 and the drain region 14. The semiconductor circuit region 100 may also include a non-silicide film 40 formed in the direction of the source region 16 from the gate electrode 27.

For example, a non-silicide film refers to a region where silicide material is not formed on the semiconductor substrate. The non-silicide film may be formed in a context where the insulating film is directly in contact with the substrate, without having the silicide layer on the substrate as an intervening film.

The semiconductor circuit region 100 may further include a non-silicide film 42 formed in the direction of the drain region 14 from the gate electrode 27. That is, both the silicide film 25 and the non-silicide films 40 and 42 may be disposed on the surface of the gate electrode 27. By additionally disposing the non-silicide films on the surface of the gate electrode 27, the gate-source resistance may be increased accordingly.

As an example, the semiconductor circuit region 100 may further include a first body region 15 and a second body region 17 and a first conductivity type well region 12 surrounding the drift region 13.

Also, as an example, the semiconductor circuit region 100 may further include a second conductivity type deep well region surrounding the first conductivity type well region 12.

The semiconductor circuit region 100 may further include the second body region 17 and a second body contact region 18, used for applying a bias voltage to the well region 12 between the third trench insulating film 130 and the source region 16. The well region 12, the first body region 15, the second body region 17, and the second body contact region 18 may have the same conductivity type, for example, a P-type conductivity type. However, as discussed above, in another example the conductivity type in question is an N-type conductivity type. The first trench insulating film 110 may be disposed between the gate electrode 27 and the drain region 14, and/or on the drift region 13. Also, at least a portion of the first trench insulating film 110 may overlap the gate electrode 27 in the vertical direction.

The first trench insulating film 110 may be simultaneously etched with the same mask as the alignment key 210. Thus, the first trench insulating film 110 may have the same depth as the alignment key 210 and may be disposed shallower than the second trench insulating film 120. For example, a depth ratio between the first trench insulating film 110 and the second trench insulating film 120 may be in a range of 1:2 to 1:10. Preferably, the depth ratio between the first trench insulating film 110 and the second trench insulating film 120 may be in a range of 1:5 to 1:10.

The depth Xj of the drift region 13 may be formed to be deeper than that of the first trench insulating film 110, in order to transmit currents toward the source region. As shown in the example of FIG. 2, the second trench insulating film 120 may be formed deeper than the junction boundary between the drift region 13 and the well region 12. As a result, the devices may be easily isolated.

In some examples, in order to increase the breakdown voltage, the depth Xj of the drift region 13 may be variously adjusted, conditioned on the assumption that it is formed deeper than the depth of the second trench insulating film 120.

Figure 3:
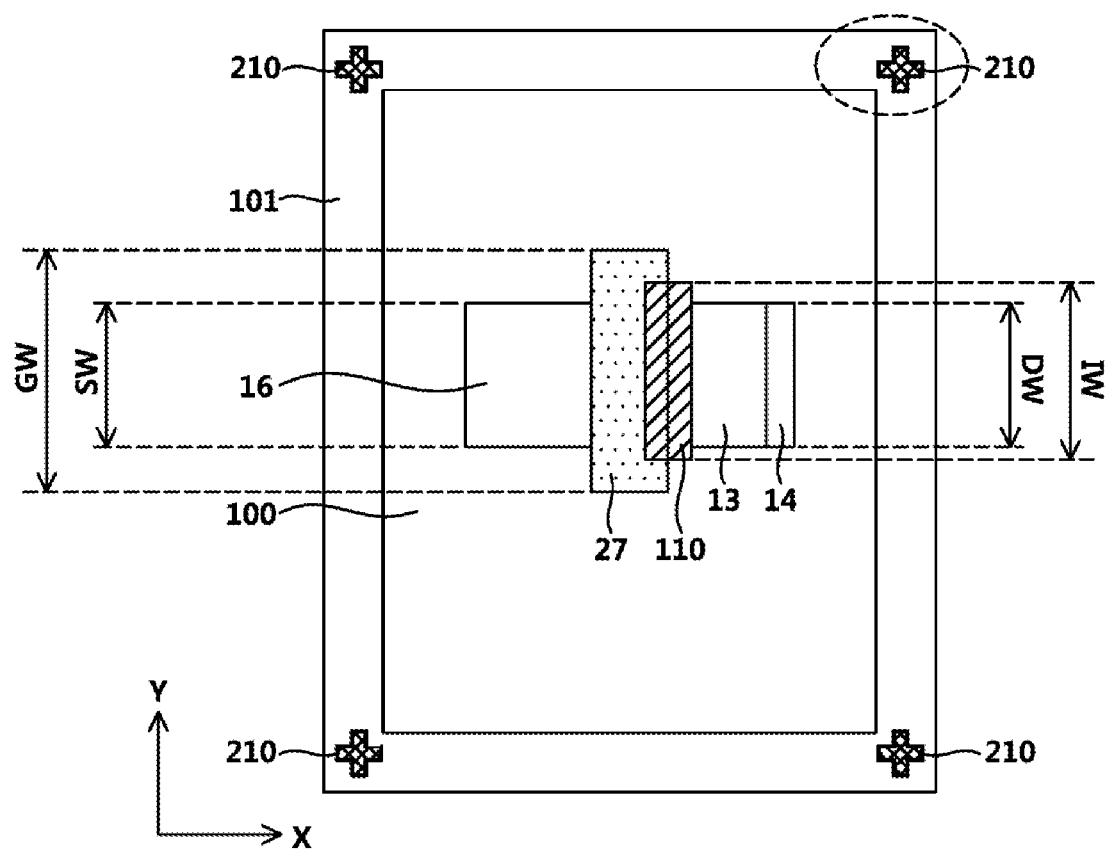
FIG. 3 is a top view of an EDMOS semiconductor device according to an example.

FIG. 3 is a top view of an EDMOS semiconductor device according to an example. In the example of FIG. 3, the X-axis direction is the channel direction. The length in the Y-axis direction may also be referred to as the width.

Referring to the example of FIG. 3, the semiconductor device may include a scribe line 101 and a semiconductor circuit region 100. A plurality of alignment keys 210 may be disposed in the scribe line 101. The semiconductor circuit region 100 may include at least one device, the device including a gate electrode 27, a source region 16, a drain region 14 and a first trench insulating film 110, as shown in the example of FIG. 2.

In the semiconductor circuit region 100, the first trench insulating film 110 may be disposed between the gate electrode 27 and the drain region 14, which may reduce the electric field from the drain region 14 toward the source region 16.

The width IW of the first trench insulating film 110 may be less than the width GW of the gate electrode 27. However, the width IW of the first trench insulating film 110 may be greater than the width SW of the source region 16. Likewise, the width IW of the first trench insulating film 110 may be greater than the width DW of the drain region 14. In order to alleviate the electric field in the channel region, the length IW of the first trench insulating film 110 may be greater than the length SW and the length DW of the source region 16 and the drain region 14, respectively. If the length IW of the first trench insulating film 110 is less than the lengths, that is, SW and DW, of the source region 16 and the drain region 14, respectively, the electric field may be concentrated in the edge region where the first trench insulating film ends. As a result, the device or the operation of the device may be degraded. As shown in the example of FIG. 3, the planar area occupied by the first trench insulating film 110 may be formed to be smaller than the planar area occupied by either the source region 16 or the drain region 14. This relative size is used for successful operation of the device by ensuring sufficient current on the drain side.

In the example of FIG. 3, the alignment key 210 may be formed at four corners of a polygonal region in the scribe line 101, surrounding the semiconductor circuit region 100. The alignment key 210 may be used to align a mask used for a lithography process. For example, the alignment key 210 may be disposed at various positions in order to accurately align the mask, such as for use during the lithography process.

Figure 4:
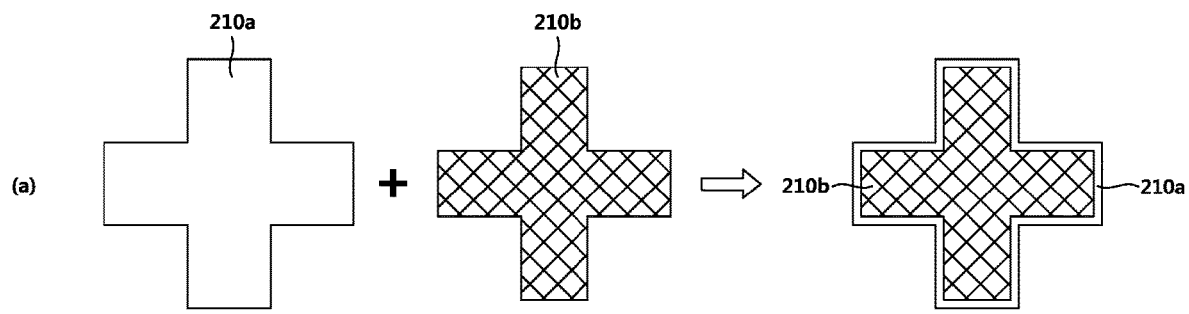
FIG. 4 shows several alignment keys according to the present examples.
Figure 4:
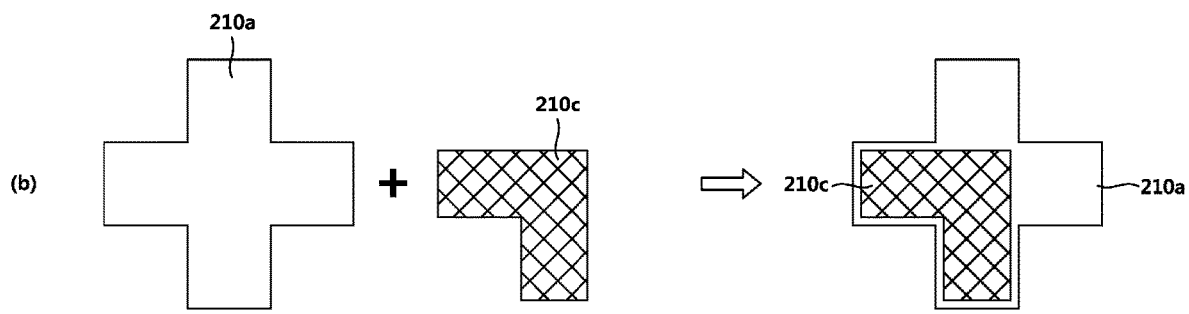

In order to precisely align the mask, the alignment key 210 can be formed in various shapes of polygons such as a square polygon or a non-square polygon. For example, as shown in the example of FIG. 4 at (a), a cross-shaped first alignment key 210a may be disposed in the scribe line, and a second alignment key 210b may be overlapped with the first alignment key 210a. Therefore, the first alignment key 210a and the second alignment key 210b may be entirely overlapped with one another.

As another example, as shown in the example of FIG. 4 at (b), a cross-shaped first alignment key 210a may be disposed in the scribe line 101 and a third alignment key 210c may be disposed at a position corresponding to the first alignment key 210a in the mask. The third alignment key 210c may not have the same shape as the entire first alignment key 210a, but may have a shape that overlaps only some parts of the first alignment key 210a. For example, in FIG. 4 at (b), cross-shaped first alignment key 210a is only partially covered by third alignment key 210c because the third alignment key 210c is L-shaped. However, the third alignment key 210c still overlaps with at least a portion of the first alignment key 210a.

Figure 5:
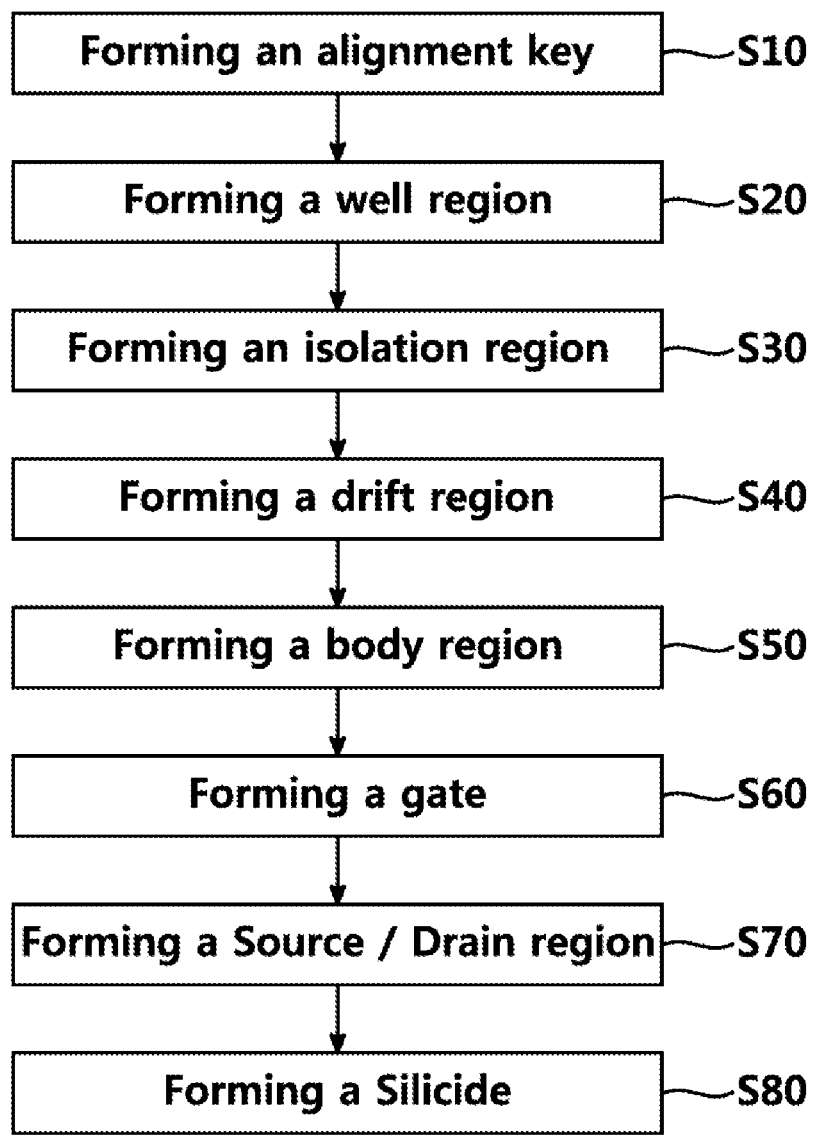
FIG. 5 is a flowchart illustrating an EDMOS semiconductor device manufacturing method of the present examples.

FIG. 5 is a flowchart illustrating an EDMOS semiconductor device manufacturing method of an example.

Referring to the example of FIG. 5, an EDMOS semiconductor device manufacturing method may include the following operations. In operation S10, forming an alignment key on a scribe line. In operation S20, forming a well region on the semiconductor circuit region. In operation S30, forming an isolation region. In operation S40, forming a drift region. In operation S50, forming a body region. In operation S60, forming a gate. In operation S70, forming a source/drain region. In operation S80, forming a silicide.

The above manufacturing method is described further with reference to FIGS. 6A to 6H. According to an example, the present disclosure illustrates a method that may include, for example, forming a first trench insulating film of a first depth on a substrate, forming at least one second trench insulating film that is spaced apart from the first trench insulating film and has a second depth that is greater than the first depth, forming a first conductivity type body region and a second conductivity type drift region in the substrate, forming a gate electrode to overlap the first trench insulating film, forming a source region in the body region, and forming a drain region in the drift region, forming a silicide film on the drain region, and forming a non-silicide film between the first trench insulating film and the drain region. At this time, the first trench insulating film is formed to overlap both the drift region and the gate electrode.

The semiconductor device of the present examples may have a scribe line 101 and a semiconductor circuit region 100. The semiconductor circuit region 100 may be a region where devices are formed, and the scribe line 101 may correspond to a region dividing a boundary between the semiconductor circuit regions 100. Subsequently, the scribe line 101 and the semiconductor circuit region 100 are not described again in detail, but may be interpreted within the context of the entire disclosure, based on the above description.

Figure 6A:
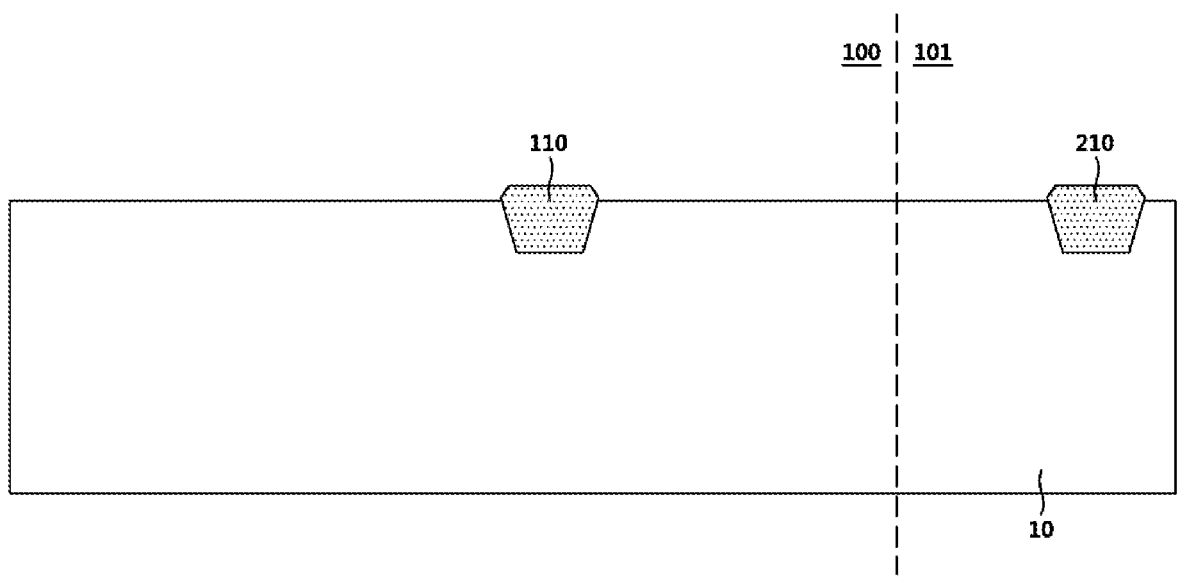
FIG. 6A to FIG. 6H are cross-sectional views illustrating a manufacturing method according to an example of the EDMOS semiconductor device shown in the example of FIG. 2.

As shown in the example of FIG. 6A, the alignment key 210 and the first trench insulating film 110 may be simultaneously and individually formed in the scribe line 101 and the semiconductor circuit region 100 of the substrate 10, respectively. According to one such example, a trench and a key hole may be simultaneously formed in the substrate for formation of the first trench insulating film and the alignment key, respectively. The trench and the key hole may have the same depth as each other. Then the trench and the key hole may be filled with an insulating film to form the first trench insulating film and the alignment key, respectively.

The alignment key 210 and the first trench insulating film 110 may be disposed on the upper surface of the semiconductor substrate 10. For example, the substrate 10 may be a semiconductor substrate and may be formed out of a thin silicon plate of the first conductivity type. By being formed in the same processing step, the first trench insulating film 110 may be formed so as to have the same depth as the depth of the alignment key 210.

The first trench insulating film 110 and the alignment key 210 may be formed to have a depth of 10 to 200 nm. After forming trenches, as discussed above, the first trench insulating film 110 and the alignment key 210 may be formed by filling the trenches with a silicon oxide, a silicon nitride, and a poly-silicon (poly-Si) material or a combination of the above materials. However, these are only example materials and other, similar materials may be used in other examples to form the first trench insulating film 110 and the alignment key 210.

Because the first trench insulating film 110 may be manufactured by using the same mask as the mask used for the alignment key 210, an additional mask may not be required for manufacturing the first trench insulating film 110. Therefore, the first trench insulating film 110 may be easily formed without using additional operations or incurring additional costs.

Figure 6B:
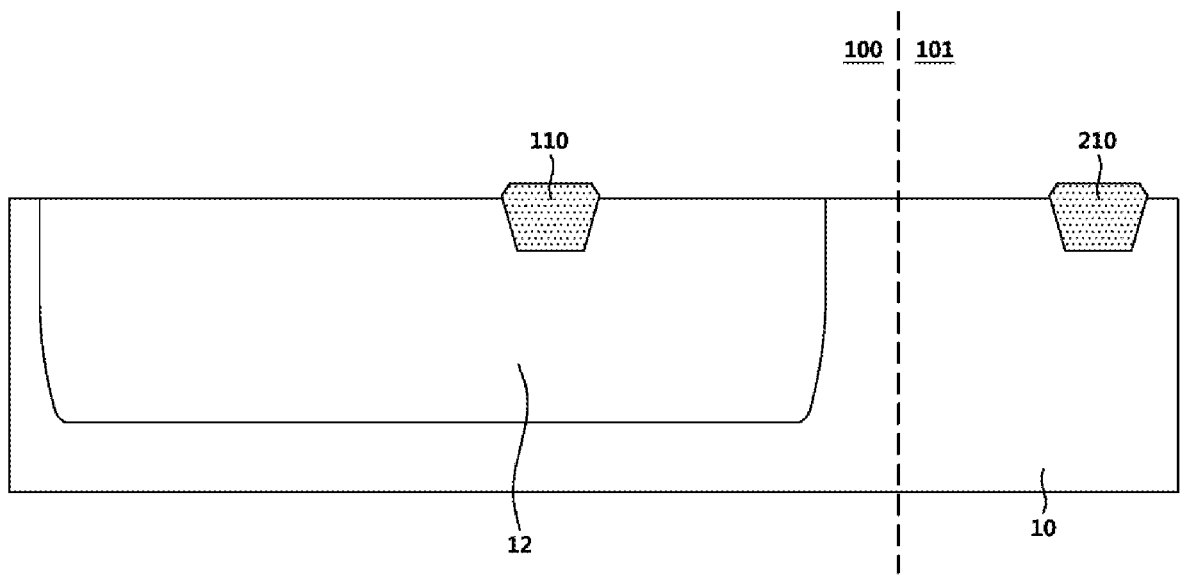

In the example of FIG. 6B, the first conductivity type well region 12 may be formed by using ion implantation techniques at an energy of 20 to 100 KeV into the semiconductor substrate 10 of the semiconductor circuit region 100, using a P-type impurity. For example, such a P-type impurity may be boron or boron difluoride ($BF_2$). However, these are only examples and other similar P-type impurities may be used in other examples. The dose of the well region 12 may be 1.5E10 to 1.5E15 atoms/$cm^2$. Injecting impurities for ion implantation may be performed several times. For example there may be, first, second and third ion implantations. However, more or fewer ion implantations may be performed in other examples. The depth of the well region 12 may vary depending on the drain voltage. A well-driver-in annealing process may be performed after the well region 12 is formed.

Figure 6C:
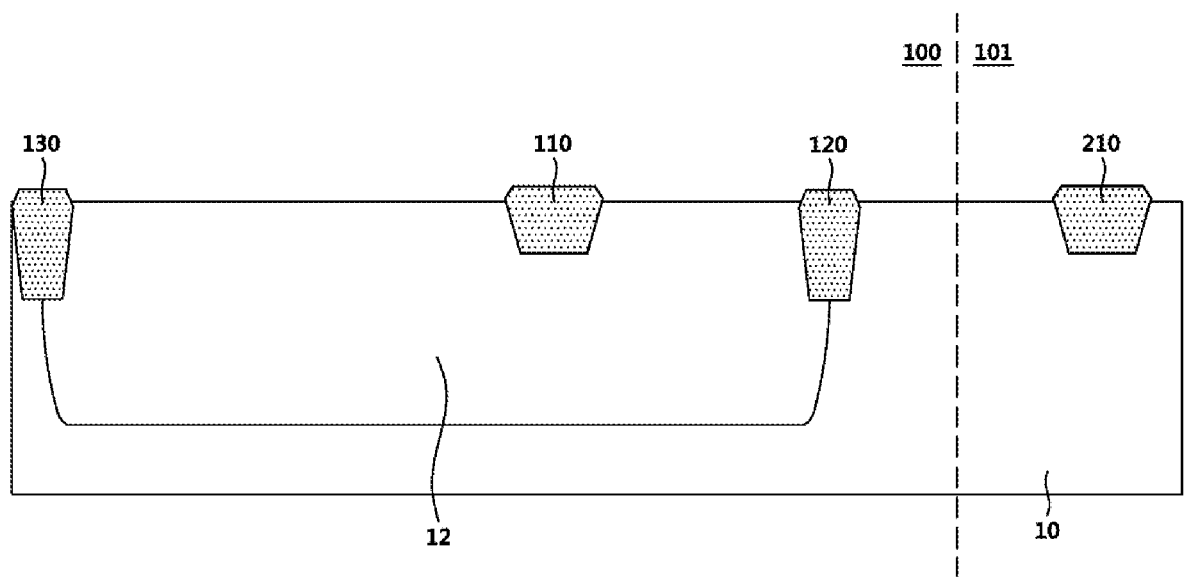

In the example of FIG. 6C, the second trench insulating film 120 and the third trench insulating film 130 may be formed in the substrate. The second and third trench insulating films 120 may be formed by using Shallow Trench Isolation (STI), Medium Trench Isolation (MTI), or Deep Trench Isolation (DTI) techniques, so as to have a desired depth for device isolation. When formed by using STI or MTI, the second trench insulating films 120 may be formed to a depth of 0.3 to 2 um. When formed by using DTI, the second trench insulating films 120 may be formed to a depth of 2 to 20 um. Accordingly, by adjusting depth in this manner, devices are isolated accordingly.

Figure 6D:
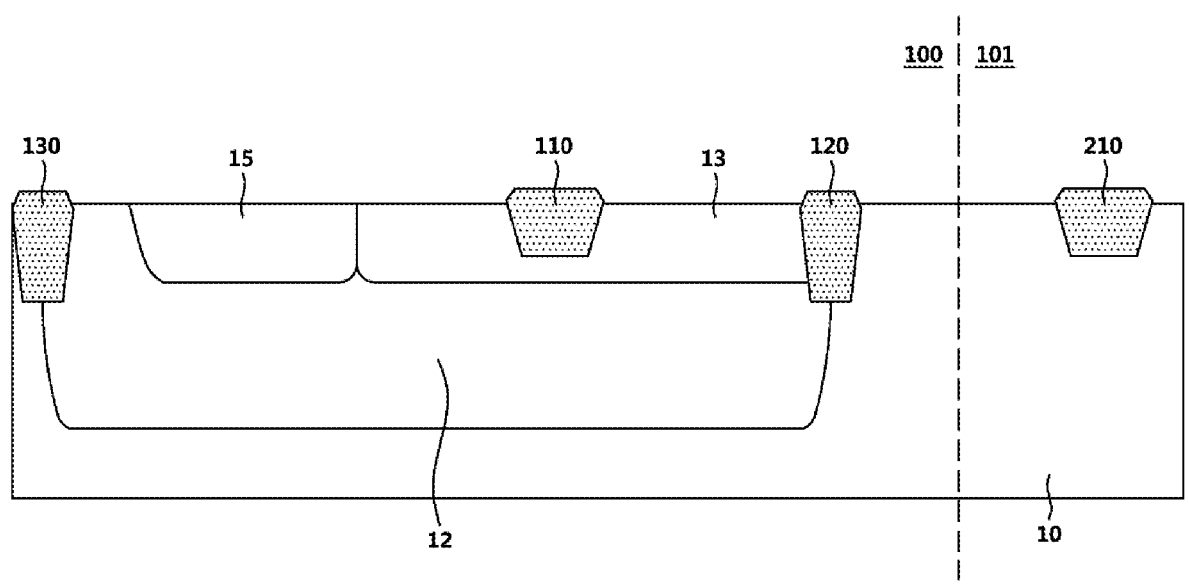

The second conductivity type, for example, N-type, drift region 13 may be formed between the two second trench insulating films 120 in the example of FIG. 6D. After a photoresist, not illustrated, is applied, an exposure process may be performed using a drift mask. More specifically, a photoresist pattern may be formed so that the drift region is opened. Thereafter, the N-type dopants may be ion-implanted to form the drift region 13. Then, the photoresist pattern may be removed. Depending on the drain voltage, a first and second ion implantation for the drift region 13 may be performed with different energy, respectively. If necessary, a third ion implantation process with a greater depth may be performed. The drift region 13 may be formed at various depths, based on the assumption that the drift region 13 is formed deeper than the first trench insulating film 110, in order to successfully transmit currents to the source region 16.

Subsequently, the first conductivity type, for example, P-type, first body region 15 is formed. The first body region 15 may be a channel region. The first body region may be formed in the well region 12 and may overlap with the gate electrode 27. In the present examples, the first trench insulating film 110 may be formed shallower than the drift region 13 because the first trench insulating film 110 may be formed to have the same depth as the alignment key 210.

The first body region 15 may be referred to as a P-type well region and may be formed using a P-type impurity, for example, boron or boron difluoride ($BF_2$). As discussed above, these are example P-type impurities and should not be taken as limiting. In such an example, the depth of the first body region 15 may be 50 to 300 nm. Also, the depth of the first body region 15 may be greater than the depth of the first trench insulating film 110 and may be less than the depth of the second trench insulating film 120.

The drift region 13 may be simultaneously formed when a logic N well region is formed, in order to save on the manufacturing cost. The drift region may be formed using a dopant such as phosphorous or arsenic, where these are examples of possible N-type dopants used in examples. The drift region 13 may have a depth of 50 to 300 nm. The depth of the drift region may be greater than that of the first trench insulating film 110 and may be less than the depth of the second trench insulating film 120. Accordingly, the drift region 13 may be used as an N-type extended drain junction region.

Figure 6E:
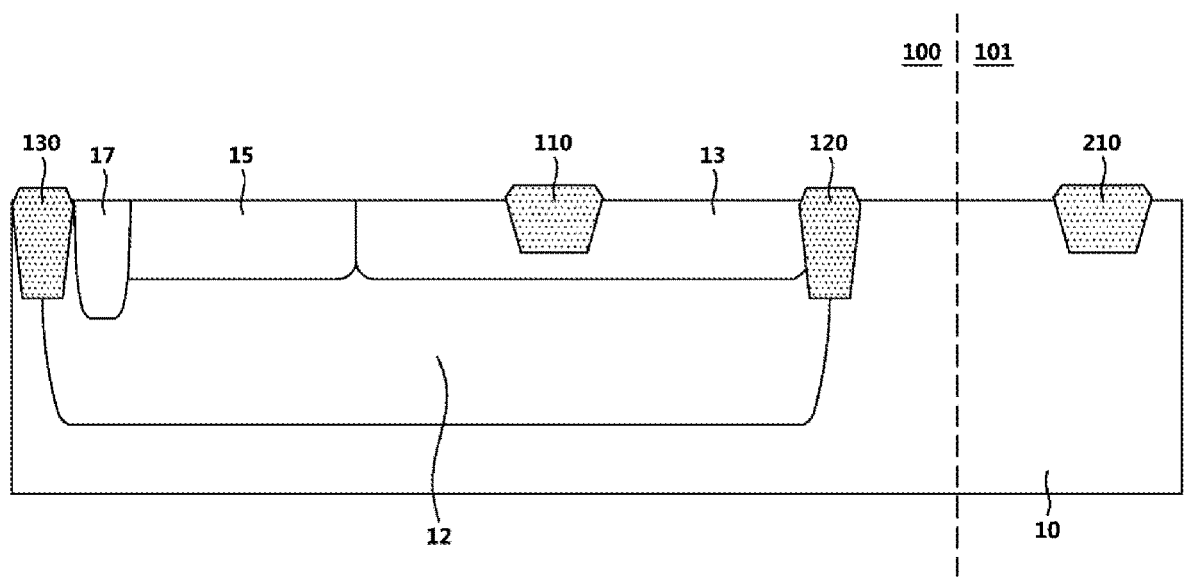

In the example of FIG. 6E, a second body region 17 may be formed close to the first body region 15 for applying a bias voltage to the first conductivity type well region 12. The second body region 17 may be formed to be deeper than the first body region 15. The second body region 17 may be formed to be in contact with the first body region 15.

Figure 6F:
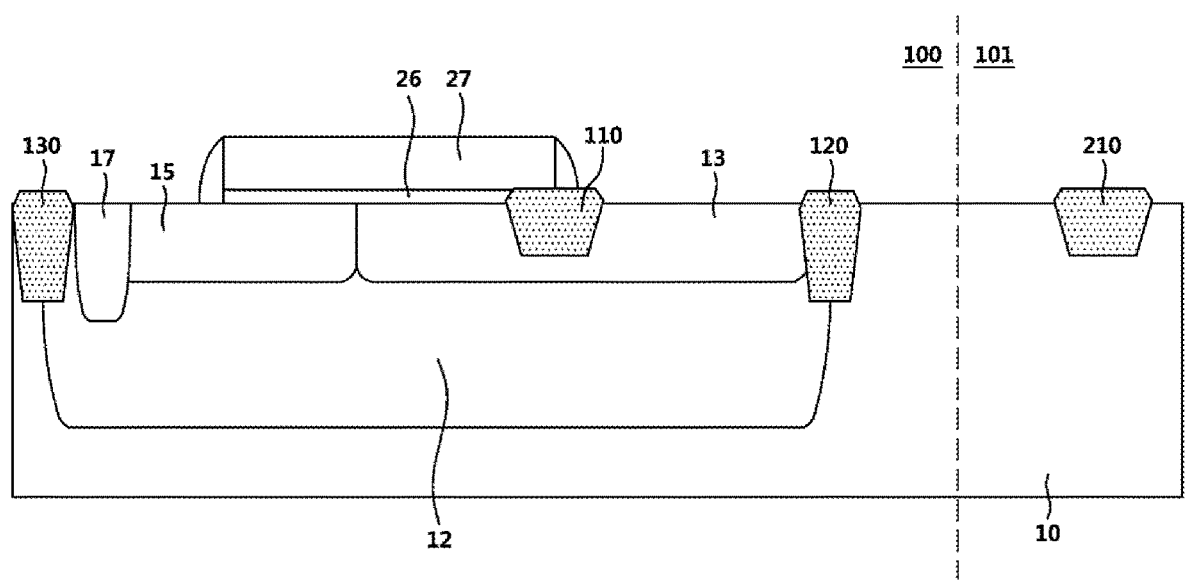

In the example of FIG. 6F, a gate insulating film 26 and a gate electrode 27 may be formed between a part of the first body region 15 and the first trench insulating film 110.

Figure 6G:
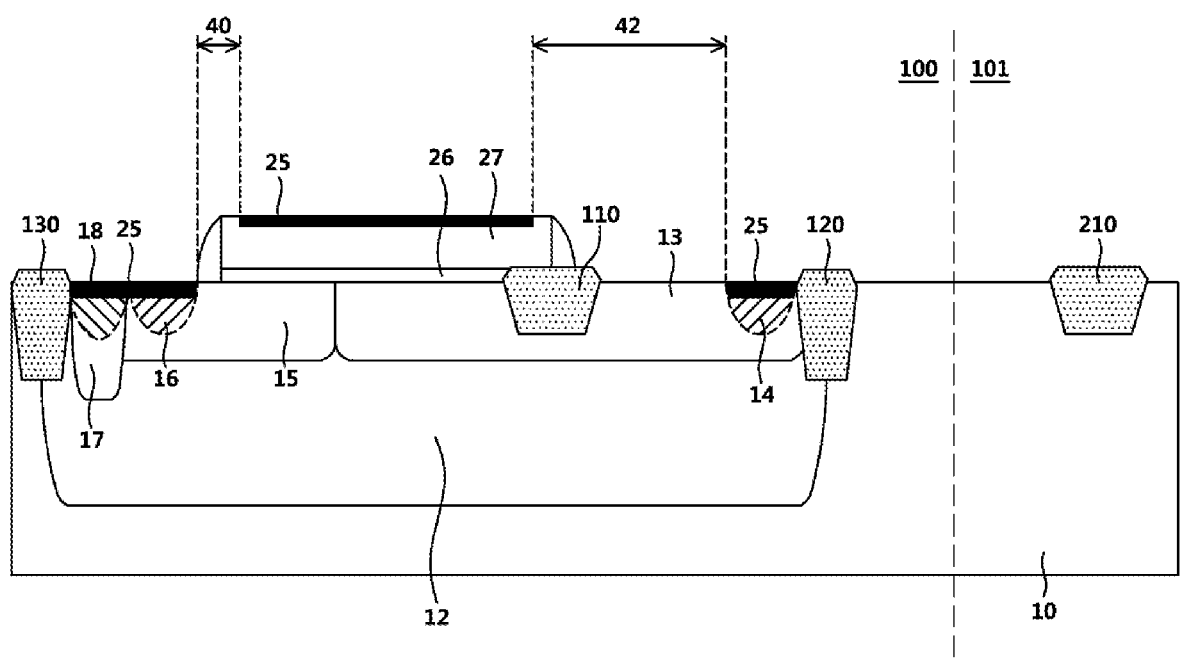

In the example of FIG. 6G, the source region 16 and the drain region 14 may be formed by further injecting impurities into the first body region 15 and the drift region 13, respectively. The second body contact region 18, having a higher doping concentration, is formed in the second body region 17.

Subsequently, a silicide film 25 may formed on semiconductor devices formed in the semiconductor circuit region 100. The silicide film 25 may be formed of a material such as titanium silicide, cobalt silicide, or nickel silicide. However, these are only example silicides, and other similar materials may be used in other examples. The silicide film 25 may be formed on the drain region 14, a part of the gate electrode 27, the source region 16 and the second body contact region 18. Thus, the non-silicide film 42 is disposed between the gate electrode 27 and the drain region 14 and the non-silicide film 40 is also disposed between the gate electrode 27 and the source region 16. Additionally, the non-silicide film may be formed on a part of the surface of the gate electrode.

Figure 6H:
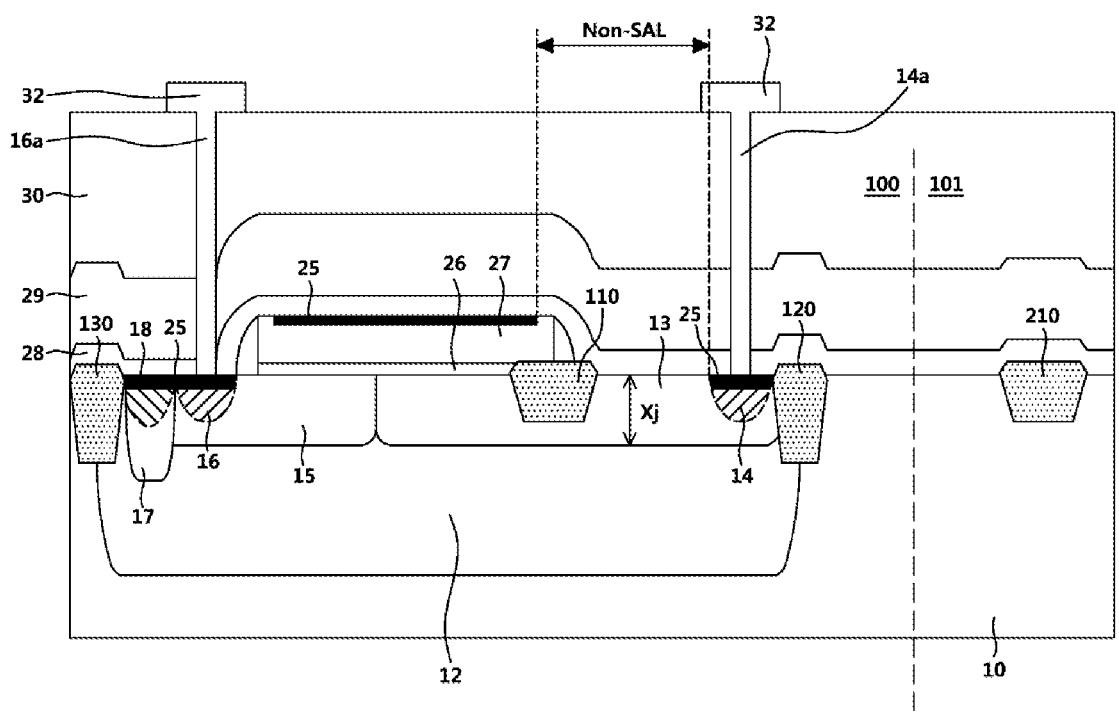

In the example of FIG. 6H, the first interlayer insulating film 28 may be formed on the semiconductor device. The first interlayer insulating film 28 may be formed on the non-silicide film and the silicide film 25. The first interlayer insulating film 28 may be used as an etch stop layer to form a borderless contact, and may be deposited by a silicon nitride oxide (SiON) or a silicon nitride. The first interlayer insulating film 28 may be deposited by using a technique such as low pressure chemical vapor deposition (LPCVD) or plasma enhanced chemical vapor deposition (PECVD). However, these are only examples, and other appropriate deposition techniques may be used in other examples.

The semiconductor device may be formed by laminating the second interlayer insulating film 29 and the third interlayer insulating film 30 onto the first interlayer insulating film 28. At this time, the thicknesses of the first, the second and the third interlayer insulating films may be equal to or different from each other in various examples. The semiconductor device may form a source contact plug 16a and a drain contact plug 14a by etching a portion of a plurality of interlayer insulating films. The metal interconnection 32 may be formed after forming the source contact plug 16a and the drain contact plug 14a.

The first interlayer insulating film and the second interlayer insulating film may be formed of different materials. For example, USG (Un-doped Silicate Glass), PSG (Phosphorous Silicate Glass), BPSG (Boron Phosphorous Silicate Glass), or Silicon Oxide ($SiO_2$) may be deposited on the second interlayer insulating film 29 by using PECVD, and are non-limiting examples of materials that may be used for the first interlayer insulating film and the second interlayer insulating film. The third interlayer insulating film 30 may be deposited by PECVD using a TEOS (tetraethylorthosilicate) material. After forming the third interlayer insulating film 30, the third interlayer insulating film 30 may be formed to be flat by performing a CMP (Chemical Mechanical Polishing) process on the third interlayer insulating film 30. The source contact plug 16a and the drain contact plug 14a may be formed using aluminum (Al) or tungsten (W). However, these are only example materials, and other metallic materials may be used in other examples, as appropriate. The metal interconnection 32 may be formed of aluminum (Al) or copper (Cu). However, these are only example materials, and other metallic materials may be used in other examples, as appropriate.

As another example, the semiconductor device manufacturing method may include forming a first trench having a first depth in a substrate, forming a first conductivity type well region in the substrate, forming a second trench having a second depth that is greater than the first depth, forming first and second trench insulating films by filling the first and second trenches with insulating materials, forming a first conductivity type body region and a second conductivity type drift region in the first conductivity type well region, forming a gate electrode to overlap the first trench insulating film, forming a source region in the body region, forming a drain region in the drift region, forming a silicide film on the drain region, and forming a non-silicide film between the first trench insulating film and the drain region. In such an example, the first trench insulating film may be formed to overlap the second conductivity type drift region and the gate electrode.

Referring to FIGS. 7A to 7H, the manufacturing method according to an example, as discussed above, is described. For convenience of description, the differences from the first embodiment shown in FIGS. 6A to 6H are the main focus of the description.

Figure 7A:
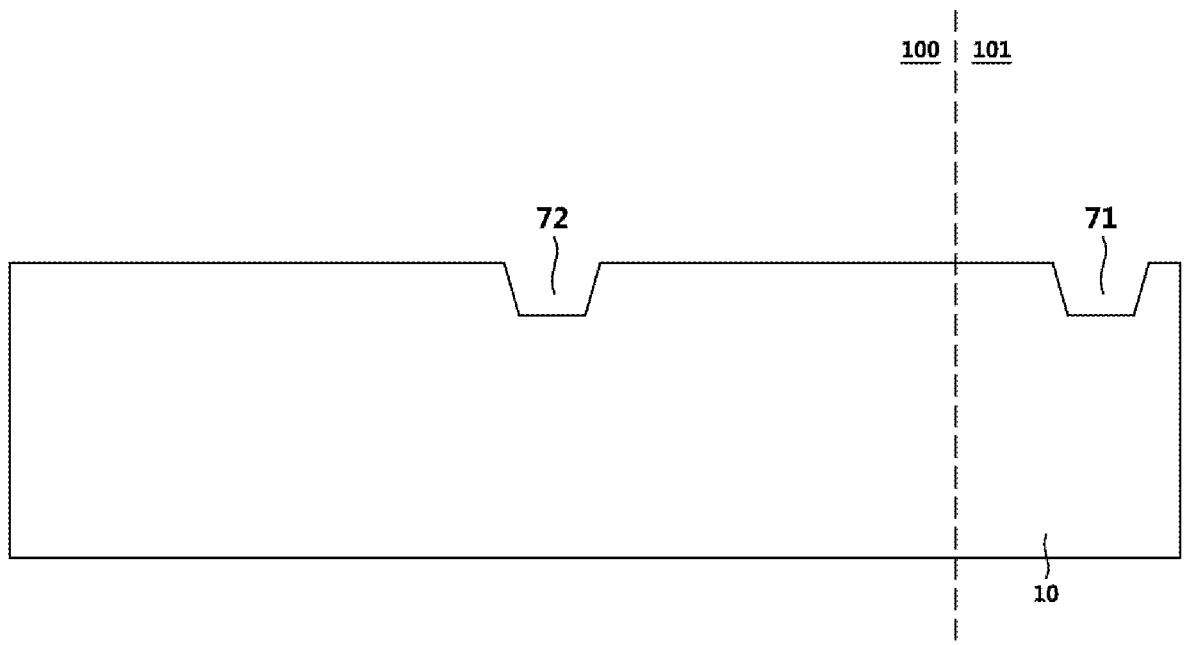
FIG. 7A to FIG. 7H are cross-sectional views illustrating a manufacturing method according to an example of the EDMOS semiconductor device shown in the example of FIG. 2.

In the example of FIG. 7A, a first trench 71 and a second trench 72 are simultaneously formed at the same depth. In such an example, the first trench 72 is a key hole used for formation of the alignment key. The first trench 71 may be formed in the scribe line 101 and may correspond to the trench of the alignment key 210. The second trench 72 may be formed in the semiconductor circuit region 100 and may correspond to the trench of the first trench insulating film 110.

Figure 7B:
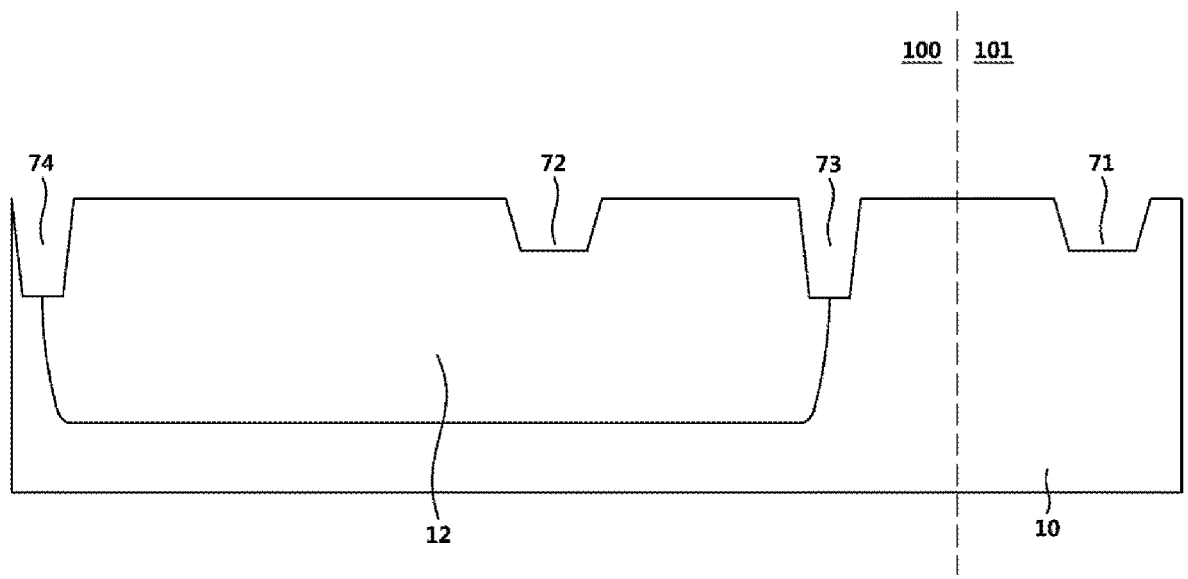

In the example of FIG. 7B, a first conductivity type well region 12 may be formed in the semiconductor substrate 10 of the semiconductor circuit region 100. A third trench 73 and a fourth trench 74 for the second trench insulating film, which may STI, MTI, or DTI, as discussed in greater detail, above, are formed. For example, the depth of the third and fourth trenches 73 and 74 may be much greater than the depth of the first and second trenches 71 and 72. In an example, the first and second trenches 71 and 72 may be STI and MTI. In an example, the third and fourth trenches 73 and 74 may be formed before a well region is formed.

Figure 7C:
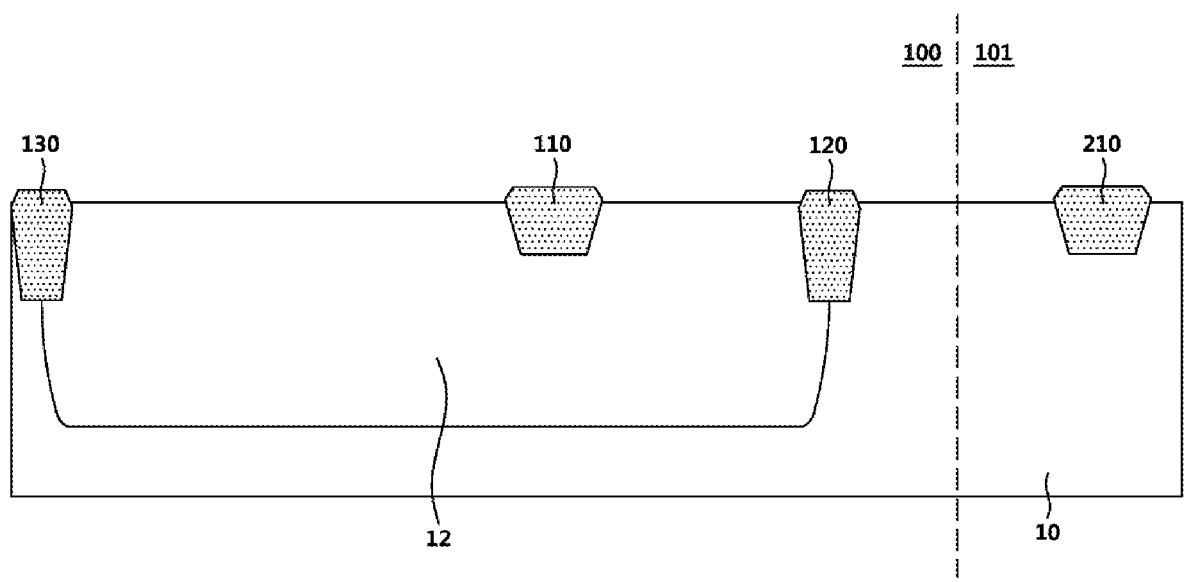
Figure 7D:
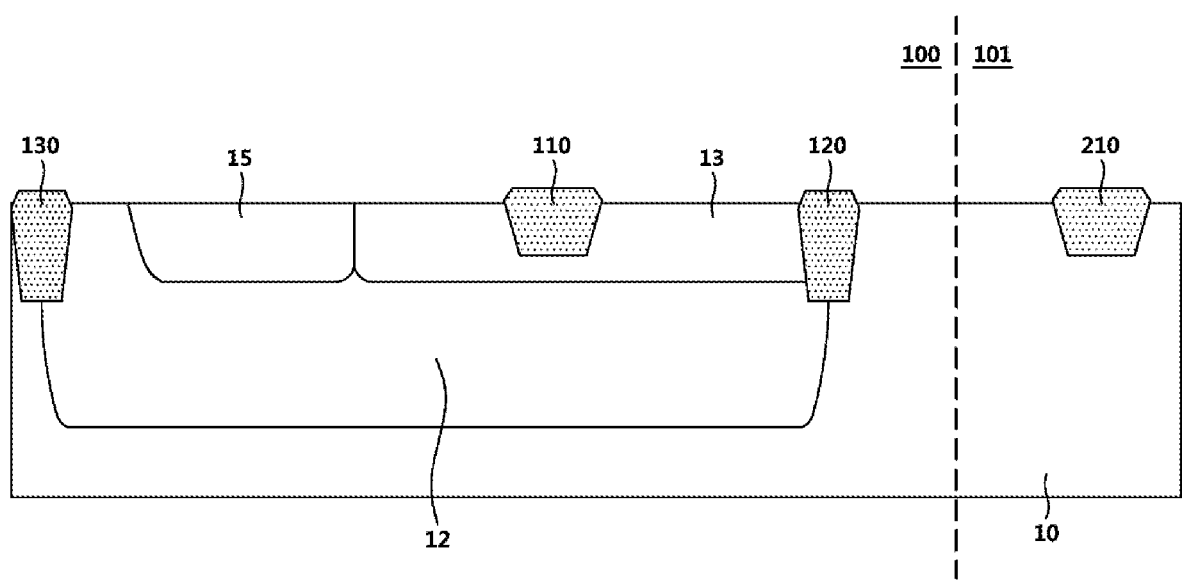
Figure 7E:
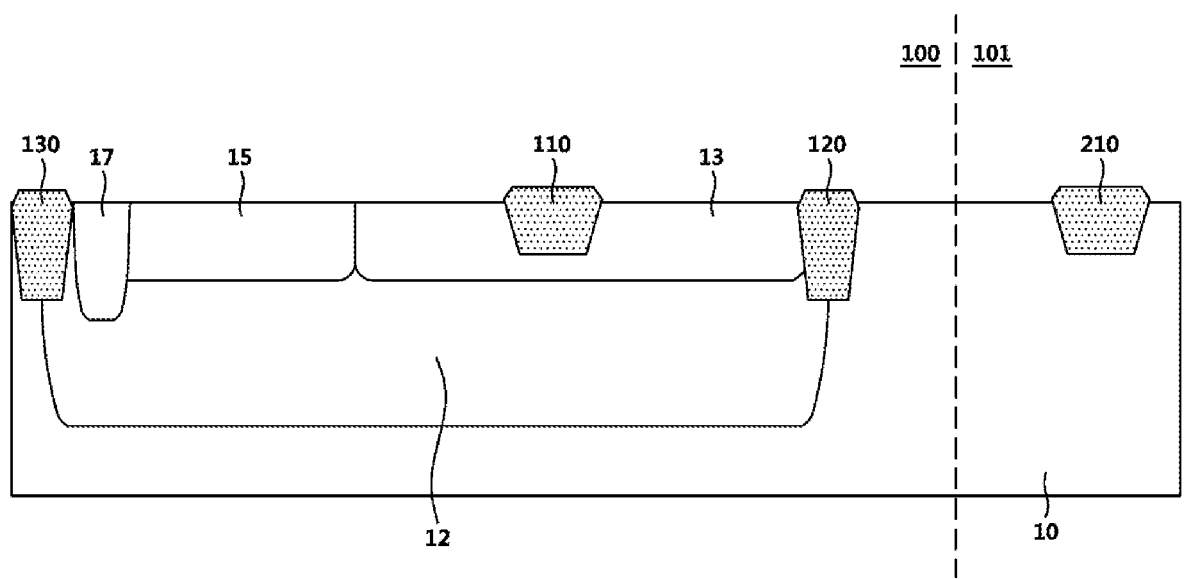
Figure 7F:
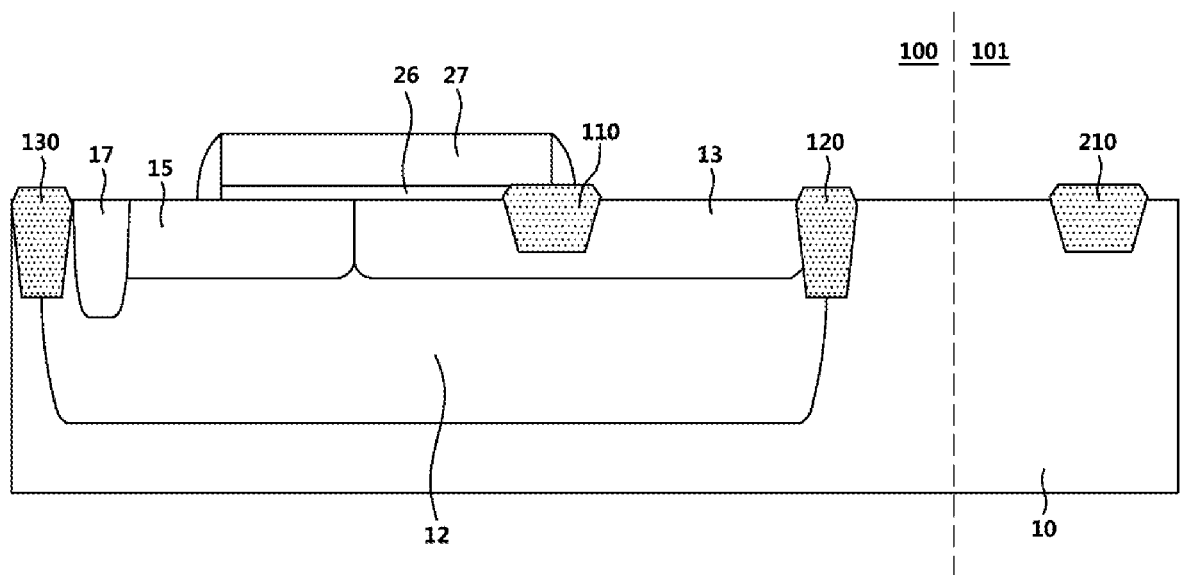
Figure 7G:
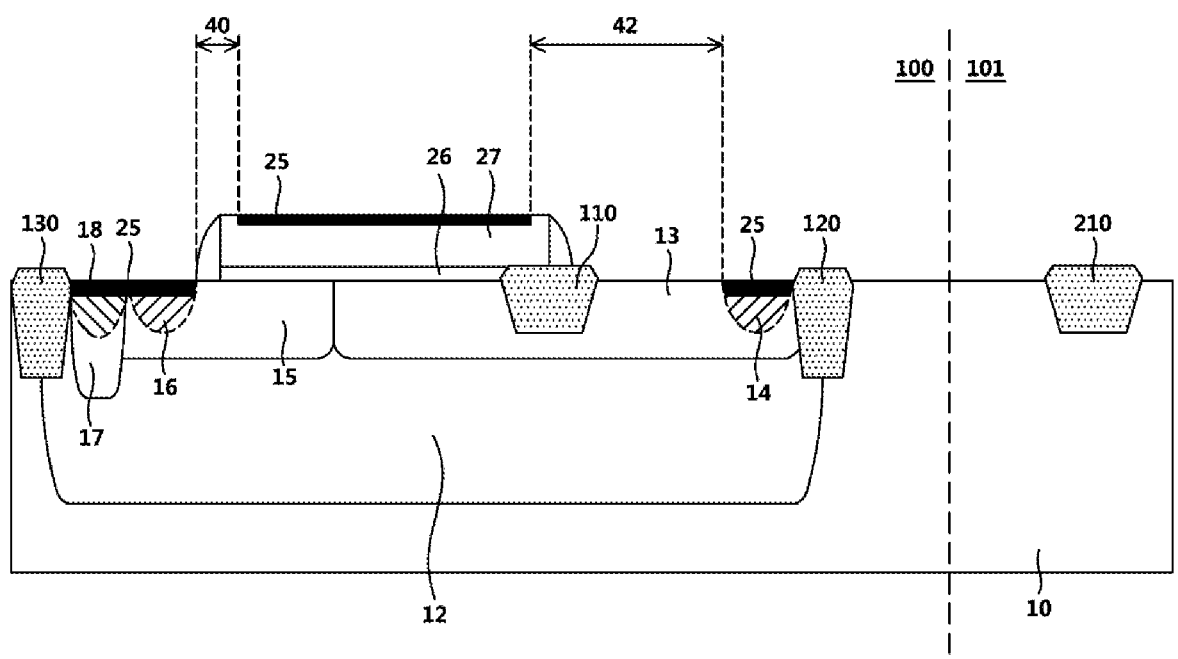
Figure 7H:
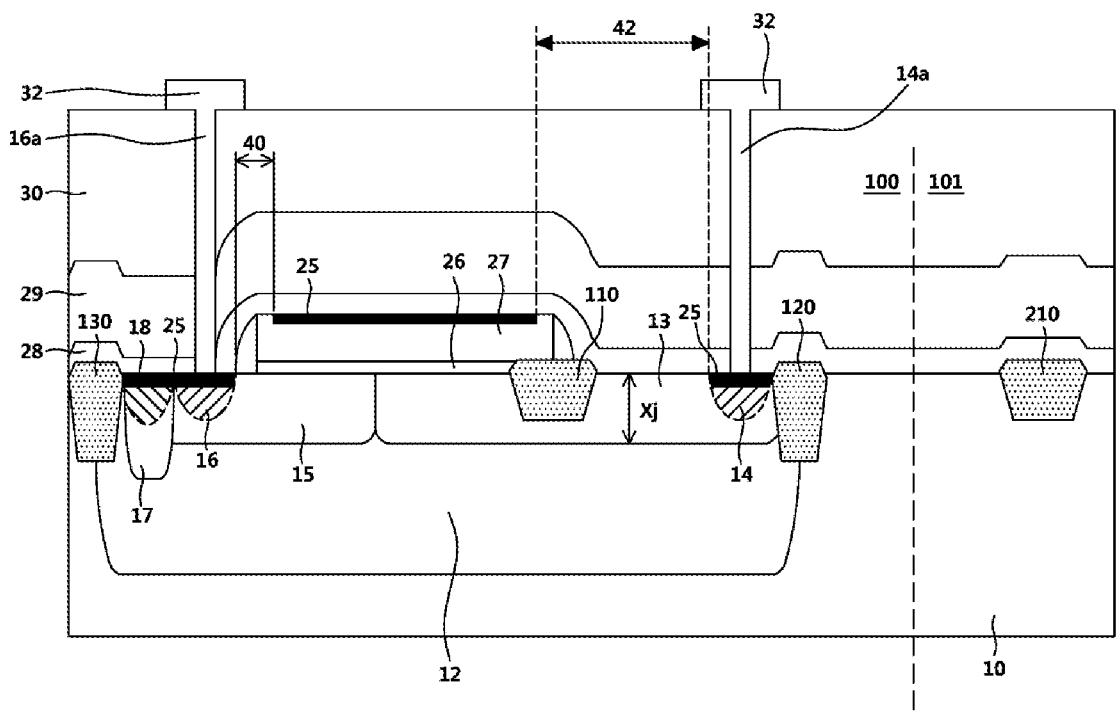

In the example of FIG. 7C, the alignment key 210, the first trench insulating film 110 and the second trench insulating film 120 may be formed by filling the first and second trenches 71 and 72 and the third and fourth trenches 73 and 74 with insulating materials. In such an example, the first trench insulating film 110 and the alignment key 210 may be formed to be shallower than the second trench insulating film 120.

Because FIGS. 7D to 7H are manufactured in the same manner as in FIGS. 6D to 6H, the description of the respective drawings is omitted for brevity, but FIGS. 7D to 7H may be interpreted properly by reference to the description of FIGS. 6D to 6H, above.

Figure 8:
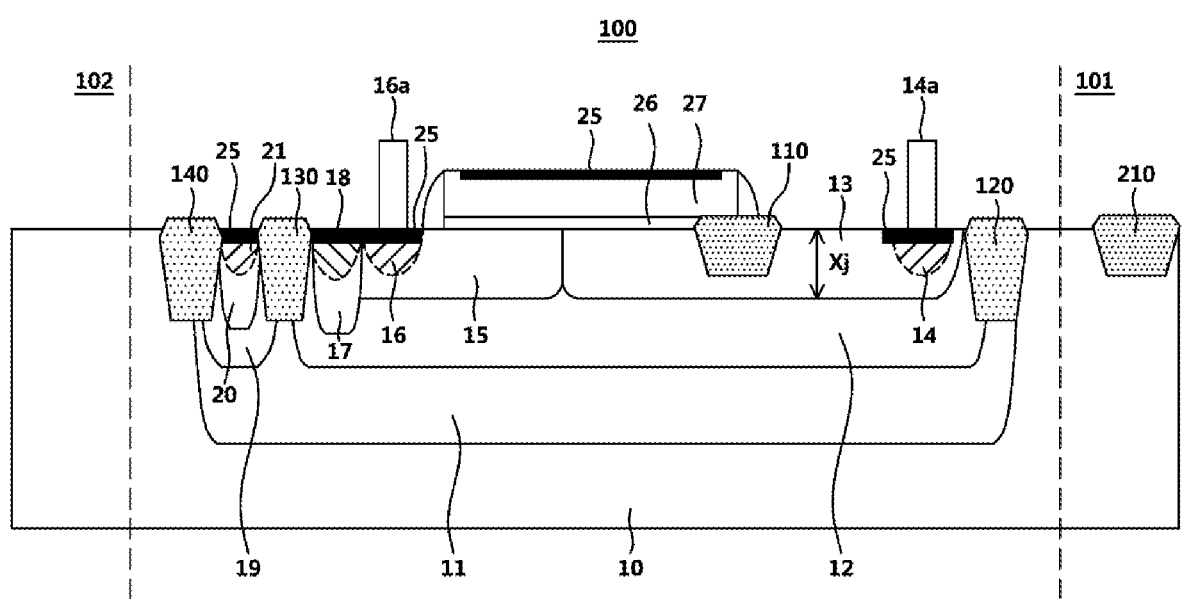
FIG. 8 illustrates an EDMOS semiconductor device according to an example.

FIG. 8 illustrates an EDMOS semiconductor device according to an example.

Referring to the example of FIG. 8, the semiconductor device 100 may further include a second conductivity type deep well 11 in the semiconductor device of FIG. 2.

The second conductivity type deep well 11 may be formed in the substrate 10 before a well region 12 of the first conductivity type is formed. That is, the first conductivity type impurities may be injected into the second conductivity type deep well 11 to form the first conductivity type well region 12. The second conductivity type deep well 11 may further include a second contact deep well region 19, a second contact well region 20, and a second contact region 21.

The second conductivity type deep well 11 may cause isolation from the other device 102 and may isolate the first conductivity type well region 12 from the substrate 10. The second contact deep well region 19, the second contact well region 20, and the second contact region 21 may all be structures for applying a bias voltage to the second conductivity type deep well region 11. The fourth trench insulating film 140 may be further included in order to isolate the second contact regions 19, 20 and 21 from the source region or the other device 102. As the other device 102, there may be a separate logic device or memory device provided.

Because the other configuration aspects of FIG. 8 are the same as that of FIG. 2, a detailed description of the configuration of the semiconductor device of FIG. 8 that overlaps the semiconductor device of FIG. 2 may be interpreted with reference to the corresponding description of FIG. 2.

Figure 9:
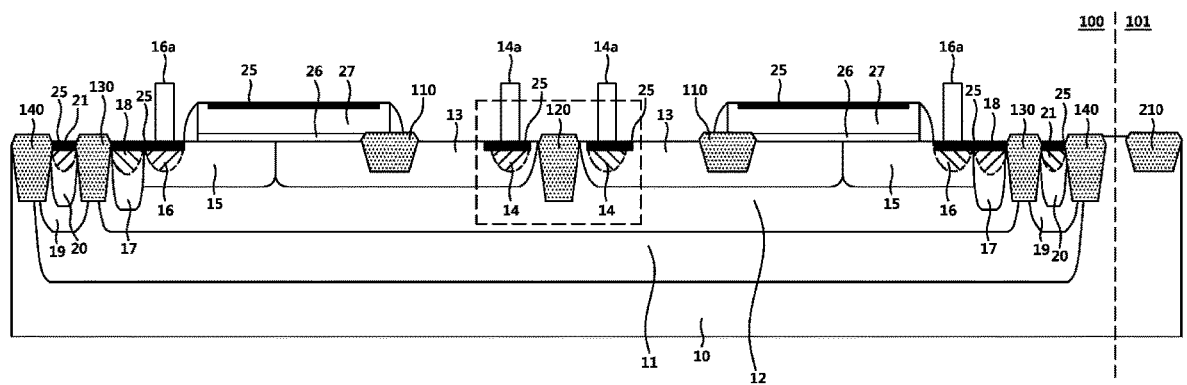
FIG. 9 shows an EDMOS semiconductor device according to an example.

FIG. 9 shows an EDMOS semiconductor device according to another example. Specifically, the example of FIG. 9 illustrates a structure for forming a plurality of devices.

FIG. 9 illustrates a semiconductor device having a symmetrical structure with respect to a dotted box region. Referring to the example of FIG. 9, the semiconductor circuit region 100 may include two semiconductor devices whose both sides are symmetrical with respect to the second trench insulating film 120 in the dotted box area. Each of the two semiconductor devices may be formed to have the same structure as shown in the example of FIG. 2 or the example of FIG. 8.

The first trench insulating film 110 may be formed to reduce the electric field from the drain region 14 toward the source region 16. Accordingly, the first trench insulating film 110 may be disposed between the gate electrode 27 and the drain region 14 and may be disposed on the drift region 13. At least a part of the first trench insulating film 110 may overlap the gate electrode 27 in the vertical direction.

The first trench insulating film 110 may be formed by being simultaneously etched by the same mask as the alignment key 210. The first trench insulating film 110 may have the same depth as the alignment key 210, and may be disposed shallower than the second trench insulating film 120. For example, the depth ratio between the first trench insulating film 110 and the second trench insulating film 120 may be in a range of 1:2 to 1:10. The depth ratio between the first trench insulating film 110 and the second trench insulating film 120 may also be in a range of 1:5 to 1:10.

The drift region 13 may be formed to be deeper than the depth of the first trench insulating film 110, having the same depth as the alignment key 210 in order to transmit currents toward the source region. As shown in the dotted box region in the example of FIG. 9, the junction boundary line between the drift region 13 and the well region 12 may be formed to be shallower than the second trench insulating film 120.

Figure 10:
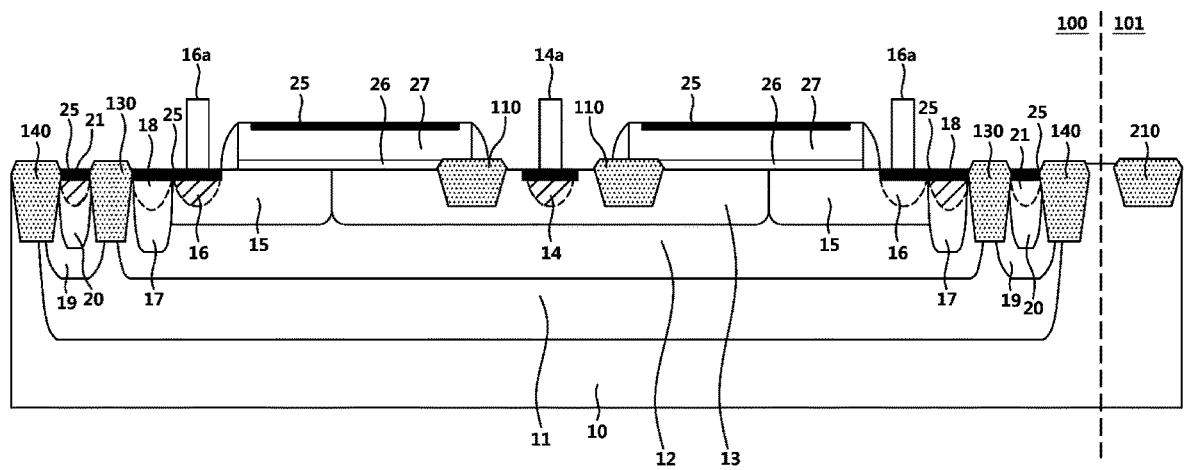
FIG. 10 illustrates an EDMOS semiconductor device according to an example.

FIG. 10 illustrates an EDMOS semiconductor device according to an example. This structure is symmetrical with respect to the common drain terminal 14a and the drain region 14.

Referring to the example of FIG. 10, the semiconductor circuit region 100 may include two semiconductor devices, both sides of each of which are symmetrical with respect to the common drain terminal 14a and the common drain region 14. Each of these two semiconductor devices may have a structure as shown in the example of FIG. 2 or the example of FIG. 8.

When formed with a plurality of devices, there may be an advantage that the chip area is reduced, because the common drain terminal 14a and the common drain region 14 may be formed, as discussed, so that the drift region 13 may be jointly occupied. Likewise, the well region 12 may not be individually formed on the first device and the second device, but may be formed as a long single well region 12. The same discussion may apply to the deep well region 11.

The first trench insulating film 110 may be formed to reduce the electric field from the drain region 14 toward the source region 16 and may be disposed between the gate electrode 27 and the drain region 14 and may be disposed on the drift region 13. At least a part of the first trench insulating film 110 may overlap the gate electrode 27 in the vertical direction.

The first trench insulating film 110 may be formed by being simultaneously etched by using the same mask as the alignment key 210. The first trench insulating film 110 may have the same depth as the alignment key 210, and may be disposed shallower than the second trench insulating film 120. For example, the depth ratio between the first trench insulating film 110 and the second trench insulating film 120 may be in a range of 1:2 to 1:10. Preferably, the depth ratio between the first trench insulating film 110 and the second trench insulating film 120 may be in a range of 1:5 to 1:10.

As described above, the examples provide a semiconductor device that may reduce the electric field directed toward the source side, by using the first trench insulating film and a method of manufacturing such a first trench insulating film.

Further, the examples provide semiconductor devices which may be easy to isolate from each other, because the first trench insulating film may be shallowly formed to have the same depth as the alignment key, enabling the junction boundary between the drift region and the well region to be formed shallower than the second trench insulating film for isolation of devices, and a method of manufacturing such semiconductor devices.

In addition, the first trench insulating film of the examples which may be able to achieve all of the above-mentioned effects may be formed easily without additional processing steps or costs, because the first trench insulating film may be formed at the same step with an alignment key by being simultaneously etched with the same mask as the alignment key, or the first trench insulating film and the second trench insulating film may be formed simultaneously by filling using the same insulating material. Therefore, the examples provide a semiconductor device and a method of manufacturing of such a semiconductor device, which may be able to achieve all of the above-mentioned effects with a simple process, without additional processing steps or costs.

Additionally, the examples may provide a semiconductor device and a method of manufacturing such a semiconductor device, wherein the first trench insulating film may be formed thinner than the second trench insulating film so that easily isolates portions of the semiconductor device from each other.

In addition, the examples may provide a semiconductor device and a method of manufacturing such a semiconductor device, which can achieve all of the above mentioned effects with a simple process without additional processing steps, costs and the like.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device manufacturing method comprising:

forming a first trench insulating film of a first depth in a substrate;

forming at least one second trench insulating film that is spaced apart from the first trench insulating film and has a second depth that is greater than the first depth;

forming a body region of a first conductivity type and a drift region of a second conductivity type in the substrate;

forming a gate electrode overlapping the first trench insulating film;

forming a source region in the body region and a drain region in the drift region;

forming a silicide film on the drain region; and forming a non-silicide film between the first trench insulating film and the drain region, wherein the first trench insulating film overlaps the drift region and the gate electrode.

2. The method of claim 1, further comprising forming a well region of the first conductivity type surrounding the body region and the drift region in the substrate.

3. The method of claim 2, further comprising:
forming a body contact region of the first conductivity type in the well region.

4. The method of claim 1, wherein the first trench insulating film is formed during a same operation during which an alignment key is formed on the substrate.

5. The method of claim 4, wherein the alignment key has a shape of a square polygon or of a non-square polygon.

6. The method of claim 4, wherein the alignment key is formed on a scribe line of the semiconductor device.

7. The method of claim 1, further comprising:
forming a first interlayer insulating film on the non-silicide film and the silicide film;
forming a second interlayer insulating film and a third interlayer insulating film on the first interlayer insulating film; and
forming a contact plug by etching a portion of the first, second, and third interlayer insulating films,
wherein the first interlayer insulating film and the second interlayer insulating film are formed of different materials.

8. A semiconductor device comprising:
a first trench insulating film disposed on a substrate;
a second trench insulating film spaced apart from the first trench insulating film, and disposed, deeper into the substrate than the first trench insulating film, on the substrate;
a drain region disposed between the first trench insulating film and the second trench insulating film;
a drift region disposed to surround the first trench insulating film and the drain region, a depth of the drift region being smaller than a depth of the second trench insulating film;
a first body region disposed to be in physical contact with the drift region;
a source region disposed in the first body region;
a gate electrode disposed to overlap the first trench insulating film;
a silicide film disposed on the drain region;
a non-silicide film disposed between the first trench insulating film and the drain region;
a first interlayer insulating film disposed on the non-silicide film and the silicide film;
a second interlayer insulating film disposed on the first interlayer insulating film; and
a contact plug disposed through the first interlayer insulating film and the second interlayer insulating film,
wherein a depth of the first body region is substantially equal to a depth of the drift region, and wherein the first interlayer insulating film is in direct contact with the substrate.

9. The semiconductor device of claim 8, further comprising:
a second body region disposed to abut the first body region;
a second body contact region formed on the second body region;
a well region of a first conductivity type disposed to surround the first body region, the second body region and the drift region; and
a deep well region of a second conductivity type disposed to surround the well region.

10. The semiconductor device of claim 9, further comprising a third trench insulating film disposed on the substrate,
wherein the second body region is disposed between the third trench isolating film and the source region,
wherein the first body region, the second body region, the second body contact region and the well region have the first conductivity type, and
wherein the first, second and third trench insulating films are trench-type insulating films.

11. The semiconductor device of claim 8, wherein the first trench insulating film is a local oxidation of silicon (LOCOS) oxide film, and the second trench insulating film is a trench-type insulating film.

12. A semiconductor device manufacturing method comprising:
forming a first trench having a first depth in a substrate;
forming a well region of a first conductivity type in the substrate;
forming a second trench having a second depth that is greater than the first depth;
forming first and second trench insulating films by filling the first and second trenches with insulating material;
forming a body region of the first conductivity type and a drift region of a second conductivity type in the well region;
forming a gate electrode overlapping the first trench insulating film;
forming a source region in the body region and a drain region in the drift region;
forming a silicide film on the drain region; and
forming a non-silicide film between the first trench insulating film and the drain region,
wherein the first trench insulating film overlaps the drift region of the second conductivity type and the gate electrode.

13. The method of claim 12, further comprising:
forming a first interlayer insulating film on the non-silicide film and the silicide film;
forming a second interlayer insulating film and a third interlayer insulating film on the first interlayer insulating film; and
forming a contact plug by etching a portion of the first interlayer insulating film, the second interlayer insulating film and the third interlayer insulating film,
wherein the first interlayer insulating film and the second interlayer insulating film are formed of different materials.

14. A semiconductor device comprising:
a first trench having a first depth in a substrate;
a well region of a first conductivity type in the substrate;
a second trench having a second depth that is greater than the first depth in the substrate;

first and second trench insulating films formed by filling the first and second trenches with insulating material;

a body region of the first conductivity type and a drift region of a second conductivity type formed in the well region;

a gate electrode overlapping the first trench insulating film;

a source region in the body region and a drain region in the drift region;

a silicide film formed on the drain region; and a non-silicide film formed between the first trench insulating film and the drain region, wherein the first trench insulating film overlaps the drift region of the second conductivity type and the gate electrode, wherein the second trench insulating film has a depth greater than a depth of the drift region of the second conductivity type.

15. The semiconductor device of claim 14, further comprising:

a first interlayer insulating film formed on the non-silicide film and the silicide film;

a second interlayer insulating film and a third interlayer insulating film formed on the first interlayer insulating film; and a contact plug formed by etching a portion of the first interlayer insulating film, the second interlayer insulating film and the third interlayer insulating film, wherein the first interlayer insulating film and the second interlayer insulating film are formed of different materials.

* * * * *